United States Patent
Gendrier et al.

(10) Patent No.: US 7,333,362 B2
(45) Date of Patent: Feb. 19, 2008

(54) ELECTRICALLY ERASABLE AND PROGRAMMABLE, NON-VOLATILE SEMICONDUCTOR MEMORY DEVICE HAVING A SINGLE LAYER OF GATE MATERIAL, AND CORRESPONDING MEMORY PLANE

(75) Inventors: Philippe Gendrier, Grenoble (FR); Cyrille Dray, Eybens (FR); Richard Fournel, Lumbin (FR); Sébastien Poirier, Vizille (FR); Daniel Caspar, Saint Hilaire du Touvet (FR); Philippe Candelier, Saint Mury Monteymond (FR)

(73) Assignee: STMicroelectronics SA, Montrouge (FR)

( * ) Notice: Subject to any disclaimer, the term of this patent is extended or adjusted under 35 U.S.C. 154(b) by 64 days.

(21) Appl. No.: 10/511,712

(22) PCT Filed: Jan. 31, 2003

(86) PCT No.: PCT/FR03/00311

§ 371 (c)(1),
(2), (4) Date: Apr. 18, 2005

(87) PCT Pub. No.: WO03/088366

PCT Pub. Date: Oct. 23, 2003

(65) Prior Publication Data

US 2005/0219912 A1 Oct. 6, 2005

(30) Foreign Application Priority Data

Apr. 15, 2002 (FR) .................................. 02 04690
Jul. 25, 2002 (FR) .................................. 02 09454

(51) Int. Cl.
*G11C 16/04* (2006.01)

(52) U.S. Cl. ...................... 365/185.01; 365/185.26; 365/185.02; 365/185.33

(58) Field of Classification Search ........... 365/185.01, 365/185.26, 185.02, 185.33
See application file for complete search history.

(56) References Cited

U.S. PATENT DOCUMENTS

| 5,761,121 | A | | 6/1998 | Chang ........................ 365/185 |
| 6,002,152 | A | * | 12/1999 | Guterman et al. .......... 257/316 |
| 6,025,625 | A | | 2/2000 | Chi ............................. 257/315 |
| 6,559,007 | B1 | * | 5/2003 | Weimer ................ 257/E21.209 |
| 6,700,154 | B1 | * | 3/2004 | Vidmantas et al. ......... 257/316 |
| 6,936,849 | B1 | * | 8/2005 | Forbes et al. ................. 257/77 |
| 2001/0046164 | A1 | * | 11/2001 | Gonzalez et al. ........... 365/200 |
| 2002/0040993 | A1 | * | 4/2002 | Patelmo et al. ............. 257/315 |
| 2004/0202021 | A1 | * | 10/2004 | Atti et al. .............. 365/185.03 |

FOREIGN PATENT DOCUMENTS

EP 0 623 959 4/1994
WO 00/60672 10/2000

* cited by examiner

Primary Examiner—Thong Q. Le
(74) Attorney, Agent, or Firm—Lisa K. Jorgenson; Allen, Dyer, Doppelt, Milbrath & Gilchrist, P.A.

(57) ABSTRACT

The semiconductor memory device includes an electrically erasable programmable non-volatile memory cell having a single layer of gate material and including a floating-gate transistor and a control gate. The source, drain and channel regions of the floating-gate transistor form the control gate. Moreover, the memory cell includes a dielectric zone lying between a first part of the layer of gate material and a first semiconductor active zone electrically isolated from a second active zone incorporating the control gate. This dielectric zone then forms a tunnel zone for transferring, during erasure of the cell, the charges stored in the floating gate to the first active zone.

67 Claims, 15 Drawing Sheets

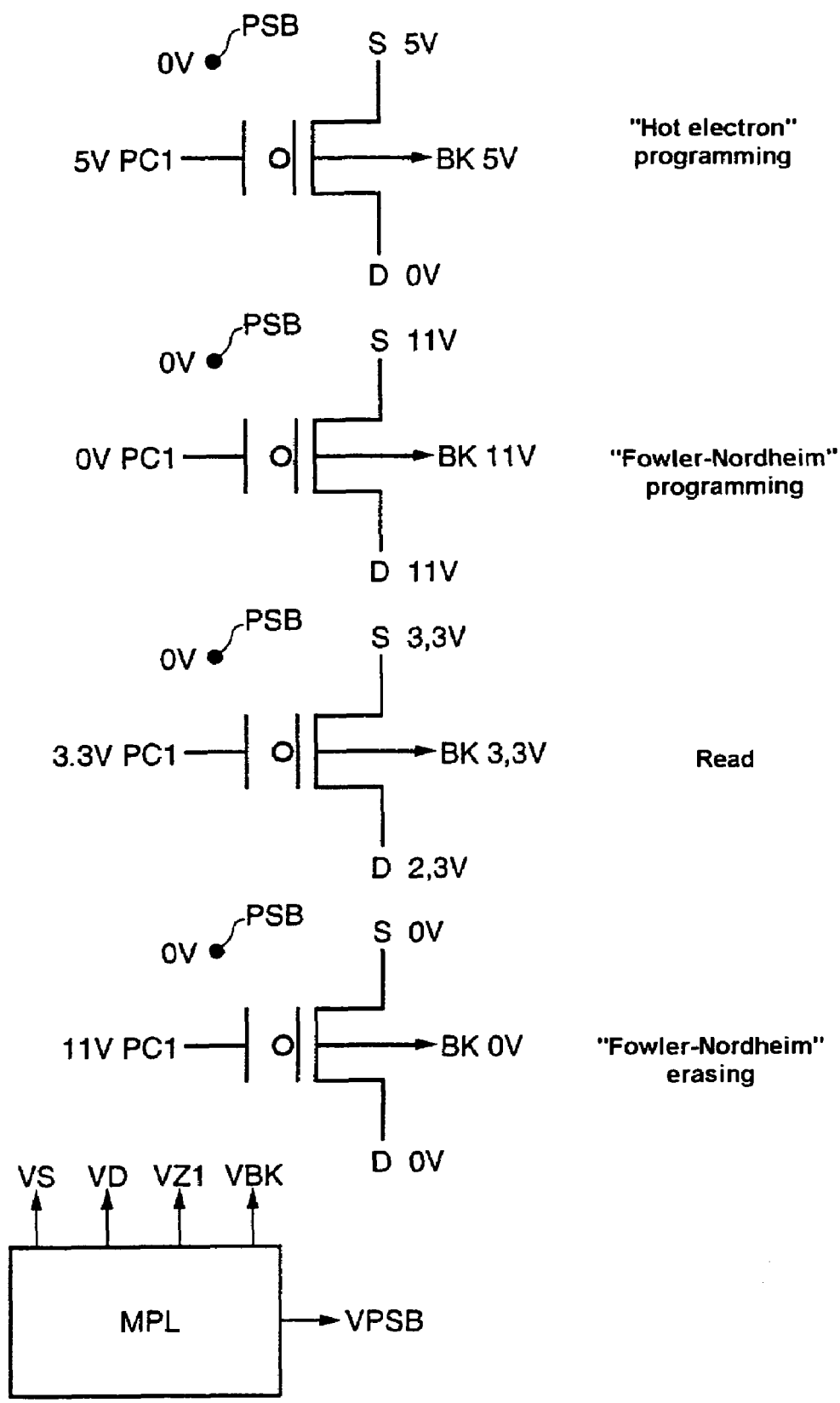

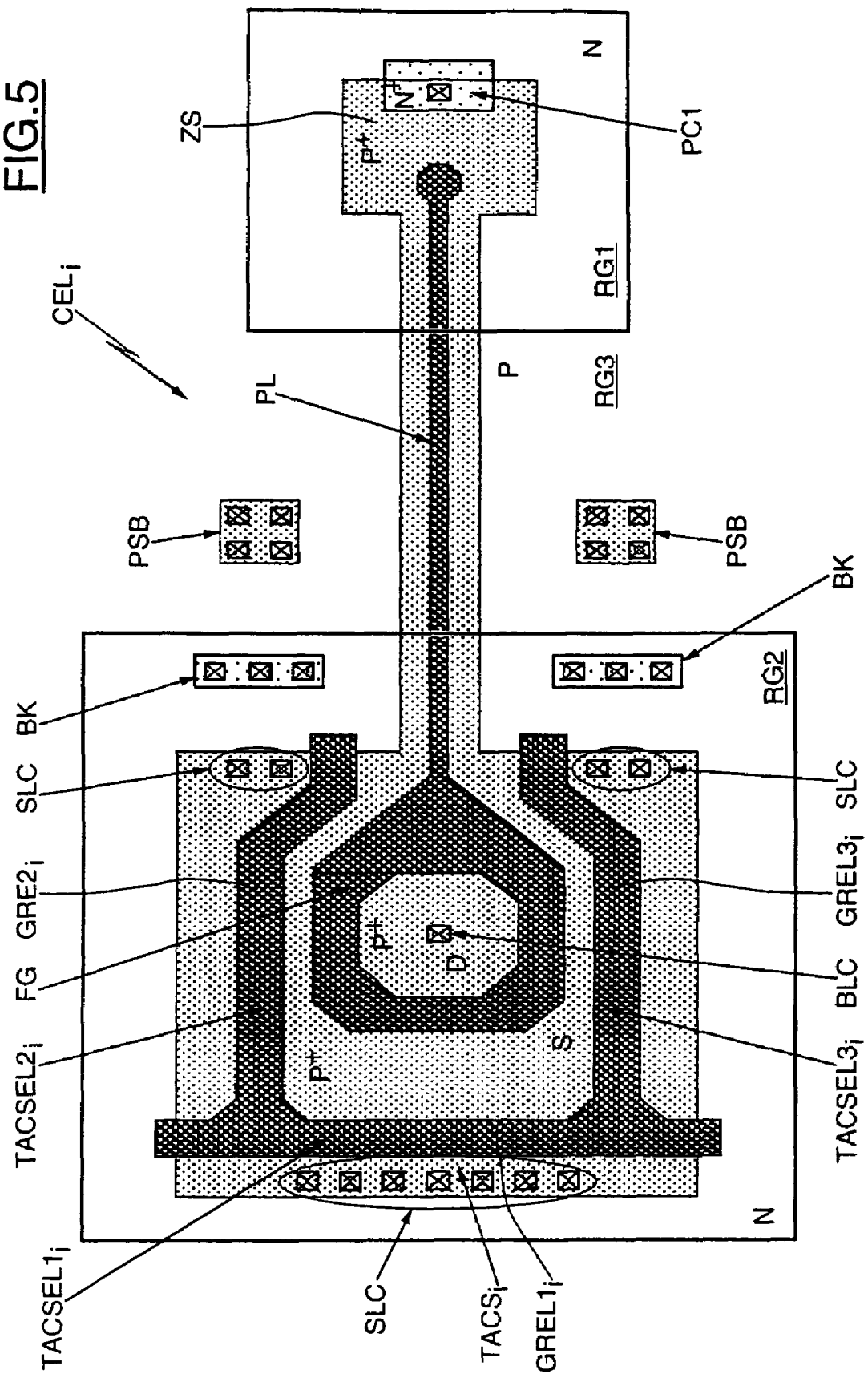

Erase cells:
column j and column j + 1

PC1 = 11V
SLC = 0V
BLC = 0V
PSB = 0V
BK = 0V
MTL = 0V

FIG.10
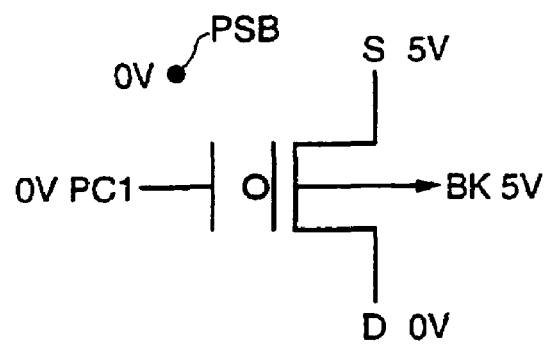
"Hot electron" programming: 1st stage
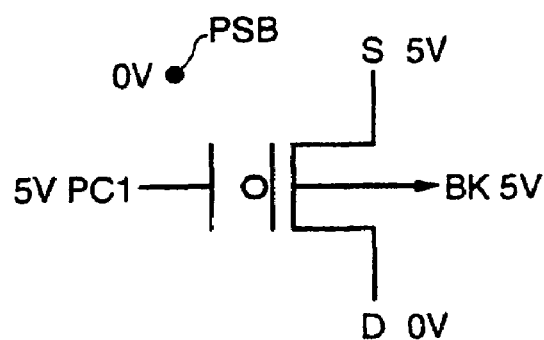
"Hot electron" programming: 2nd stage
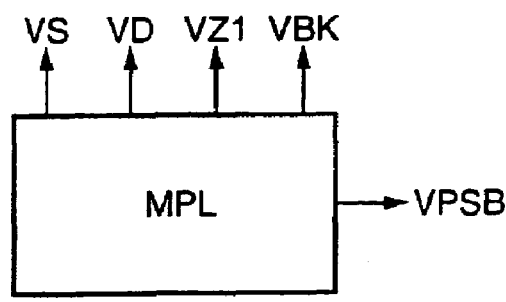

| Config. | BL1 | WL1 | WLP1 | VER1 | BL2 | WL2 | WLP2 | VER2 |
|---|---|---|---|---|---|---|---|---|
| 1 | 3.3 | 6.6 | 6.6 | 0.0 | 3.3 | 0 | 3.3 | 3.3 |
| 2 | 0.0 | 0.0 | 0.0 | 6.6 | 0.0 | 0.0 | 0.0 | 6.6 |
| 3 | 3.3-ε | 0.0 | 3.3 | 3.3 | 3.3-ε | 3.3 | 3.3 | 3.3 |

ELECTRICALLY ERASABLE AND PROGRAMMABLE, NON-VOLATILE SEMICONDUCTOR MEMORY DEVICE HAVING A SINGLE LAYER OF GATE MATERIAL, AND CORRESPONDING MEMORY PLANE

FIELD OF THE INVENTION

The present invention relates to integrated circuits and more particularly to semiconductor memory devices of the electrically erasable and programmable, non-volatile type having a single layer of gate material.

BACKGROUND OF THE INVENTION

The structure of a conventional memory cell is disclosed, for example, in U.S. Pat. No. 5,761,121 directed to a memory cell for a PMOS structure. More specifically, such a cell includes a floating-gate transistor and a control gate which is produced by implantation within a semiconductor substrate. This buried layer, which acts as control gate is capacitively coupled to the floating gate. The control gate and the floating-gate transistor are electrically isolated by an isolation zone, for example of the STI (Shallow Trench Isolation) type. The layer of gate material, generally made of polysilicon, within which the floating gate of the transistor is produced, is isolated from the active zone by a dielectric, for example, silicon dioxide.

Although such a memory cell is programmed by injecting hot electrons into the floating gate of the transistor, these being called CHE (Channel Hot Electrons), such a memory cell is electrically erased by applying a high voltage to the source, the drain and the substrate of the transistor and by applying a much lower voltage to the control gate. This induces a high reverse electric field and therefore causes the electrons stored in the floating gate to be extracted and sent into the source, drain and channel regions of the transistor, and by doing so passing through the gate oxide of the transistor.

However, this erase process, when it is repeated in a cyclic fashion, as is generally the case for memory applications, causes the gate oxide of the transistor and the threshold voltage of this transistor to be degraded. In other words, repeatedly extracting the electrons through the gate oxide of the transistor eventually causes aging of the transistor. This problem needs to be addressed.

SUMMARY OF THE INVENTION

It is an object of the present invention to provide a memory cell structure that avoids the phenomenon of transistor aging during repeated erase cycles.

It is also an object of the invention to allow the cell to be programmed either by "hot carrier" programming or by "Fowler-Nordheim" programming.

It is also an object of the invention to provide such a memory cell whose fabrication process is compatible with a conventional CMOS fabrication process.

The invention therefore provides a semiconductor memory device comprising an electrically erasable programmable non-volatile memory cell having a single layer of gate material and including a floating-gate transistor and a control gate. According to a general feature of the invention, the source, drain and channel regions of the floating-gate transistor form the control gate. Moreover, the memory cell includes a dielectric zone lying between a first part of the layer of gate material and a first semiconductor active zone electrically isolated from a second active zone incorporating the control gate. This dielectric zone then forms a "tunnel" zone for transferring, during erasure of the cell, the charges stored in the floating gate to the said first active zone.

The channel region is understood to mean here as being the semiconductor region extending between the source region and the drain region beneath the gate of the transistor.

According to the invention, the structure of the memory cell is consequently completely different from the conventional structures in the sense that it has no control gate separate from the floating-gate transistor. This is because, according to the invention, it is a part of the floating-gate transistor, and more particularly the source, drain and channel regions of this transistor, that form the control gate. Moreover, during erasure of the cell, the charges are extracted no longer through the gate oxide of the floating-gate transistor but through a gate oxide (dielectric) which is located opposite an active zone electrically isolated from the active zone incorporating the control gate, and consequently the source, channel and drain regions of the floating-gate transistor. As a consequence, according to the invention, degradation of the oxide in the tunnel zone does not cause the transistor of the cell to undergo ageing.

The fact that the source, drain and channel regions of the transistor form the control gate, and that the tunnel zone located opposite the first active zone defines the charge transfer zone, is due to the fact that the capacitive coupling between the second active zone (that in which the source, drain and channel regions of the transistor are produced) and the floating gate is greater than the capacitive coupling within the tunnel zone. The differences in capacitive coupling depend on the areas of gate material opposite the active zones and on the different voltages applied to the various electrodes of the memory cell. A person skilled in the art will know how to adjust these various parameters to obtain the desired effect.

However, to obtain the advantages of the memory cell according to the invention, while still applying reasonable voltages to the electrodes of the memory cell, that is to say voltages from around a few volts to about ten volts, it will be advantageous to choose the capacitance of the tunnel zone to be less than or equal to 30% of the total capacitance between the layer of gate material and all of the active zones of the memory cell.

According to one embodiment of the invention, the transistor has an annular gate and the layer of gate material includes, in addition to the annular gate and the first part, a linking part between this first part and the annular gate.

Several possibilities exist for the electrical isolation between the first active zone (that into which the charges will be transferred during erasure) and the second active zone (that in which the transistor is produced). According to a first embodiment, the first active zone and the second active zone are electrically isolated from each other by PN junctions intended to be reverse-biased, and on the surface by an isolation region, for example an isolation region of the shallow trench type.

In this case, and according to one embodiment, the first active zone is produced in a first substrate region (for example a well), having a first type of conductivity, for example, N-type conductivity. The second active zone is produced in a second substrate region (for example a well) also having the first type of conductivity. The first substrate region and the second substrate region are then separated by a third substrate region (for example another well) having a second type of conductivity different from the first, for example P-type conductivity. The isolation region extends between the first substrate region and the second substrate region and then includes an aperture emerging in a contact zone (for example a $P^+$ zone) in the third semiconductor region.

As a variant, the first active zone and the second active zone may be electrically isolated from each other solely by PN junctions intended to be reverse-biased. Such an embodiment allows better data retention to be obtained. This is because it has been observed that it is necessary to choose a dielectric thickness in excess of 60 Å so as to obtain good data retention. However, it has been observed that thinning of the gate dielectric occurs at the interface between the isolation zone, for example of the shallow trench type, and the gate material. This leads to inferior data retention. Consequently, the embodiment providing for there to be no overlap of the isolation region by the gate material addresses this problem.

More specifically, according to one embodiment, the layer of gate material extends entirely above the three or four mentioned substrate regions, without overlapping the isolation region. Whatever the embodiment, the first substrate region includes, on the surface, a contact zone having the first type of conductivity, for example an $N^+$-type contact zone in an N well.

This being the case, to facilitate erasure it may prove advantageous to provide, on the surface of the first active zone, in addition to the aforementioned contact, a surface zone having the second type of conductivity, for example $P^+$-type conductivity, and extending around the tunnel zone. Of course, this surface zone is electrically connected to the contact zone, for example, by siliciding. Thus, a transistor, for example a PMOS transistor, whose source and drain regions are short-circuited will be produced with the first part of the gate material. This will allow that part of the active zone located beneath the first part of the gate material to be very conducting.

It would also be possible not to limit the contact locally, but to produce, on the surface, any highly doped zone having the first type of conductivity, for example, $N^+$-type conductivity. Doing so would probably result in perimetric erasure.

According to one embodiment of the invention, the device furthermore includes bias means possessing a memory cell programming state, a memory cell read state and a memory cell erase state. In the erase state, the bias means cause Fowler-Nordheim erasing by applying a voltage to the first active zone that is much higher than the voltages applied to the source, drain and substrate regions of the transistor. In this regard, in the erase state, the bias means preferably apply equal voltages to the source, drain and substrate regions of the transistor.

In the programming state, the bias means may cause hot-carrier programming within the transistor. They may also cause Fowler-Nordheim programming, by applying preferably equal voltages to the source, drain and substrate regions of the transistor that are much higher than those applied to the first active zone. Moreover, in the read state, it will be advantageous to choose a drain/source voltage difference limited to 1 volt in absolute value. This prevents very slow reprogramming of the memory cell, or else unintentional, parasitic programming of a virgin memory cell.

The floating-gate transistor is preferably a PMOS transistor. However, the invention also applies to an NMOS transistor. The device may comprise a memory plane made up of several memory cells. The device may thus form a memory of the EEPROM type or of the FLASH type. The subject of the invention is also an integrated circuit that includes a device as defined above.

BRIEF DESCRIPTION OF THE DRAWINGS

Further advantages and features of the invention will become apparent on examining the detailed description of non-limiting embodiments and the appended drawings in which:

FIG. 4 diagrammatically illustrates biases applied to the electrodes of a memory device according to the invention, depending on the state of this device.

FIG. 5 diagrammatically illustrates a fourth embodiment of a memory device according to the invention, particularly one intended to be incorporated within a memory plane.

FIGS. 9 to 11 diagrammatically illustrate a variant of the invention, which provides two-step hot-carrier programming.

DETAILED DESCRIPTION OF THE PREFERRED EMBODIMENTS

Figure 1:
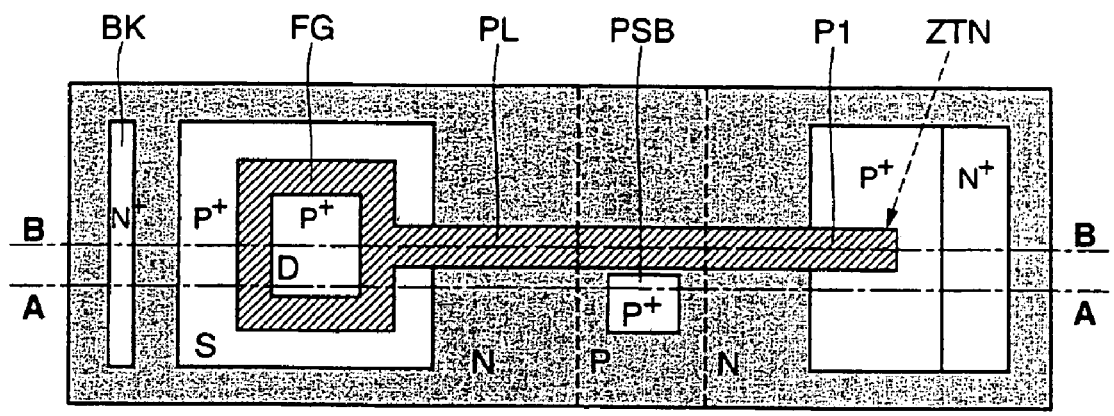
FIG. 1, 1a, 1b diagrammatically illustrate a first embodiment of a memory device according to the invention.

In the following, FIG. 1a (or alternatively 2a and 3a) and FIG. 1b (or alternatively 2b and 3b) are sections on the lines A-A and B-B, respectively, of FIG. 1 (or alternatively of FIG. 2 and FIG. 3). In FIGS. 1a and 1b, the reference SB denotes a semiconductor substrate, for example made of $P^-$-doped silicon, of an integrated circuit. This substrate SB comprises a first substrate region RG1, formed from an N-doped semiconductor well, and a second substrate region RG2, formed from another N-doped semiconductor well. The two wells RG1 and RG2 are separated by a third semiconductor region RG3 formed from a P-doped well.

The well RG3 provides the mutual electrical isolation, depthwise, of the two wells RG1 and RG2. This electrical isolation is in fact produced by PN junctions that will be reverse-biased. On the surface, the mutual electrical isolation of the two wells RG1 and RG2 is provided by an isolation region STI (shallow trench isolation). The isolation region STI includes an aperture opening into a $P^+$-doped contact zone PSB located on the surface of the well RG3. This contact PSB will be used to bias the well RG3 and also the subjacent substrate SB. The well RG1 forms a first active zone, while the well RG2 forms a second active zone.

Provided above these two active zones is a layer of a gate material, for example polysilicon, resting via a gate oxide OX, for example silicon dioxide, on the surface of the two active zones. The layer of gate material, which in its entirety forms a floating gate, includes a first part P1 vertically above the first active zone RG1.

The layer of gate material also includes an annular part FG lying above the second active zone RG2. This annular part of the gate material defines the gate FG of a PMOS transistor, also called a read or charge storage transistor, whose source S, formed from a $P^+$-type implanted region lies within the well RG2 outside the annular gate and whose drain D, also formed from a $P^+$-type implanted region, lies within the cell RG2 inside the ring forming the gate FG. The layer of gate material also includes a linking part PL connecting the annular part FG to the first part P1.

The geometry of the first part P1 has been chosen so that the capacitance of the oxide zone OX located beneath this first part P1, the zone also being called the tunnel zone ZTN for reasons that will be explained in greater detail below, is less than or equal to 30% of the total capacitance between the layer of gate material and all of the active zones of the memory cell, that is to say the sum of the capacitances formed between the gate material and each of the active zones of the memory cell.

In this way, the source, drain and channel regions, which are capacitively coupled to the gate FG, will form a control gate for this memory cell, while the tunnel zone ZTN will form a charge transfer zone for extracting, during erasure of the memory cell, the charges stored in the floating gate, transferring them to the first active zone RG1.

Regarding the control gate, it is of course the channel zone which contributes mostly to the capacitive coupling with the annular gate FG. This being so, a person skilled in the art knows that the source and drain regions also extend, by diffusion, under the annular gate FG. The source and drain regions therefore also contribute in practice to this capacitive coupling. For suitably biasing the first active zone RG1 and for making contact, this zone includes an $N^+$ implanted zone, with the reference PC1. Moreover, in this embodiment, a $P^+$-doped surface zone ZS extending around the tunnel zone ZTN is also provided.

A person skilled in the art will have noted that what has thus been formed with the first part P1 of the layer of gate material is a short-circuited PMOS transistor, that is to say one whose $P^+$-doped source and drain regions are electrically connected together. This surface zone ZS is electrically connected to the contact zone PC1, for example by surface siliciding. Regarding the second active zone RG2, this is also provided with an $N^+$ implanted region with the reference BK, for contacting and biasing this well RG2, and consequently for biasing a substrate of the read transistor.

The process for fabricating such a memory cell firstly comprises the production in a manner known per se, of the lateral isolation regions STI in the $P^-$-type substrate SB. The process then continues, in a manner known per se, with the implantation of the wells RG1, RG2 and RG3. After an oxide layer OX has been produced on the surface of the structure thus obtained, a layer of gate material, for example polysilicon, is then deposited, which is etched so as to form in this annular gate layer FG, the linking part PL and the first part P1. Next, the various $P^+$ and $N^+$ implanted regions are produced, the layer of gate material then serving especially as hard mask.

A conventional siliciding operation is then carried out on the source, drain and contact regions PC1, BK, and on the surface zone ZS. The fabrication process is then completed with conventional contacts on the source and drain regions, on the region BK and on the contact PC1.

The operation of the memory cell according to the invention will now be described, more particularly with reference to FIG. 4. In this regard, the memory device according to the invention includes a bias circuit or means MPL, for example voltage sources associated with a control logic, these bias means possessing a memory cell programming state, a memory cell read state and a memory cell erase state. In each of these states the means MPL deliver voltages VS, VD and VBK, to the source S, the drain D and the substrate BK of the transistor. They also bias the substrate RG3 with a voltage VPSB applied to the contact zone PSB and bias the first active zone RG1 with a voltage VZ1 applied to the contact zone PC1.

Another possibility of electrically programming the memory cell includes adopting what is called "hot electron" programming. More specifically, when it is wished to program the memory cell electrically, that is to say when it is wished to store charges in the floating gate, a voltage of 5 volts supplied to the source of the transistor and a voltage of 0 volts is applied to the drain, for example.

The substrate of the transistor is also biased with 5 volts and a voltage, which may vary in practice between 0 and 5 volts, for example, 5 volts, is applied to the contact PC1 of the first active zone. The substrate (contact PSB) is also biased with 0 volts. The transistor is then in the on state (provided that there is a sufficient gate/source voltage for making the transistor start to conduct), thereby saturating this transistor and generating a hole current coming from the source. These holes collide with the crystal lattice and form hot holes and hot electrons. The hot electrons are attracted to the floating gate, the potential of which drops slightly with respect to that applied to the source.

Another possible way of programming the memory cell according to the invention includes carrying out Fowler-Nordheim programming, that is to say applying a high electric field in order to lower the energy barriers and allow the electrons to flow towards the floating gate. More specifically in this case, equal voltages will, for example be applied to the source, drain and substrate of the transistor, the value of which is relatively high, for example between 8 and 11 volts, and typically 11 volts. At the same time, while the well RG3 is still biased to 0 volts, a voltage of 0 volts is applied to the contact PC1 of the first active zone. In this way, the floating gate is raised to a potential substantially equal to 10 volts, while the first active zone is at 0 volts. This therefore creates a strong electric field which will attract the electrons from the first active zone RG1 to the floating gate through the oxide of the tunnel zone ZTN.

The memory cell according to the invention therefore has the advantage of being able to be programmed in two different ways, either by hot-electron programming or by Fowler-Nordheim programming. It will thus be possible to choose the type of programming according to the envisaged applications. Hot-electron programming has a higher current consumption, more rapid, however, than Fowler-Nordheim programming, which has a lower consumption. It will therefore be preferable to choose Fowler-Nordheim programming in mobile telephony applications.

In the read state, the drain/source voltage difference is intentionally limited to −1 volt so as to avoid very slow reprogramming of the memory cells. Thus, for example, a voltage of 3.3 volts on the source and a voltage of 2.3 volts on the drain will be chosen. The substrate BK will be biased with 3.3 volts and the control gate (source and drain) may be biased with a voltage varying between 0 and 3.3 volts. Thus, if during programming a 0 is programmed into the memory cell, that is to say if, in fact, no programming has been carried out, the transistor will be off during reading.

On the other hand, if in the programming state a "1" (for example) is programmed into the memory cell, that is to say if charges are stored in the floating gate, the transistor will conduct during reading. Thus, by detecting whether or not there is a current in the read state it is possible to determine the logic value that has been written or programmed into the cell.

To erase the memory cell, a voltage is applied to the first active zone that is much higher than those applied to the source, drain and substrate regions of the transistor. As an indication, a 0 voltage is applied to the source, the substrate and the drain of the transistor and a voltage of, for example, 11 volts is applied to the contact PC1, the substrate RG3 still being biased with 0 volts. This Fowler-Nordheim erasing therefore leads to the application of a very high electric field, the reverse of that for programming, and consequently causes the charges stored in the floating gate to be extracted towards the active zone RG1, via the tunnel ZTN, as far as the contact PC1.

Figure 9:
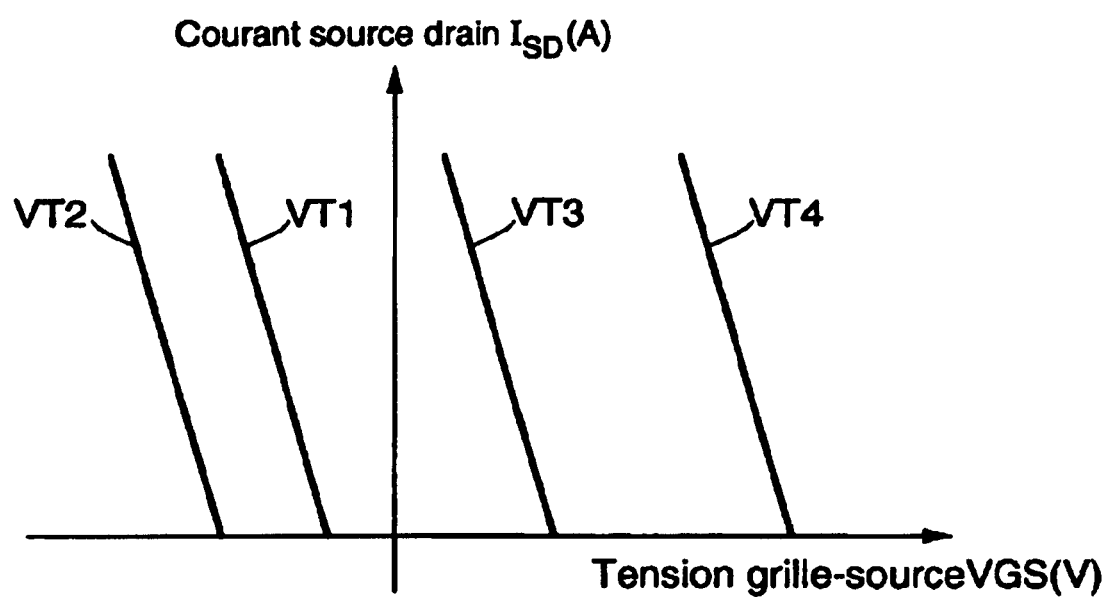

There is therefore no degradation of the oxide of the memory cell's transistor, which corresponds to the zone of highest coupling. In certain cases, the erasure of a memory cell may result in this cell being in an over-erasure state, for example when the erase time is too long. This over-erasure state is manifested, when the transistor of the cell is a PMOS transistor, by the presence of positive electrical charges in the floating gate of the transistor. This state is illustrated in FIG. 9 in terms of the voltage threshold VT. In that figure, the curve VT1 corresponds to a threshold voltage of a PMOS transistor of a fabrication output cell. Typically, the threshold voltage is around −0.6 volts.

When a cell is programmed by hot electrons, electrons are stored in the floating gate, which shifts the threshold voltage towards positive values, for example to a value of around 1.4 volts (curve VT4). The threshold voltage shift is then around 2 volts. The purpose of erasing this programmed cell is to bring the threshold voltage of the transistor substantially back to its initial value (curve VT1).

However, in the event of over-erasure, this is manifested by a shift in the threshold voltage towards negative values (for example curve VT2). In this case, it may prove extremely difficult, if not impossible, to reprogram the cell. This is because if the absolute value of the threshold voltage of the transistor remains above the absolute value of the gate-source voltage difference, the transistor of the cell cannot be turned on, therefore preventing the production of hot electrons.

To remedy this drawback, the biasing means MPL will program a memory cell having undergone an erasure, the transistor of which is a PMOS transistor, by carrying out hot-electron programming of the transistor in two successive steps, so as firstly to compensate for any residual positive charges present in the floating gate and then to perform optimum programming (FIG. 10).

More precisely, in the first step, the biasing means MPL compensate for any residual positive charges present in the floating gate by applying a compensation voltage VZ1 to the contact PC1 of the first active zone. This voltage VZ1 is, for example, equal to 0 volts, but it could also be negative, for example greater than about −500 mV. However, it is necessary to ensure that too negative a compensation voltage is not applied so as not to bring the PN diode formed by the well RG1 and the well RG3 into forward conduction.

Applying this compensation voltage, for example for 500 microseconds, not only makes it possible to compensate for the negative shift of the threshold voltage but also to initiate the hot-electron programming. Thus, at the end of this first step, the threshold voltage is shifted to the right relative to the initial voltage (curve VT3 shifted to the right relative to curve VT1). The optimum programming is then carried out by applying, for example for 100 microseconds, a voltage VZ1 to the contact PC1 of 5 volts. The threshold voltage is then again shifted to the right (curve VT4).

It will therefore have been noted that this variant of the invention makes it possible to obviate the drawback associated with over-erasure by employing two-step programming using the contact PC1 that is normally used for erasure. The invention is not limited to the embodiment that has just been described, rather it embraces all variants.

Figure 1A:
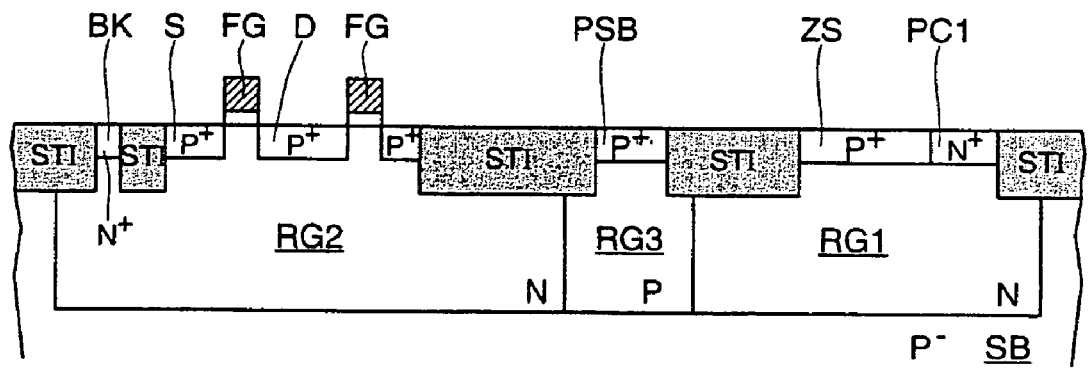
Figure 1B:
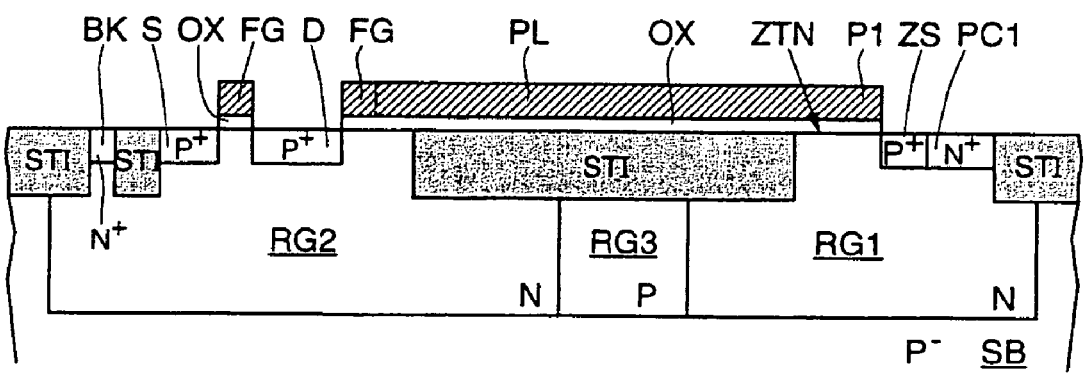
Figure 2:
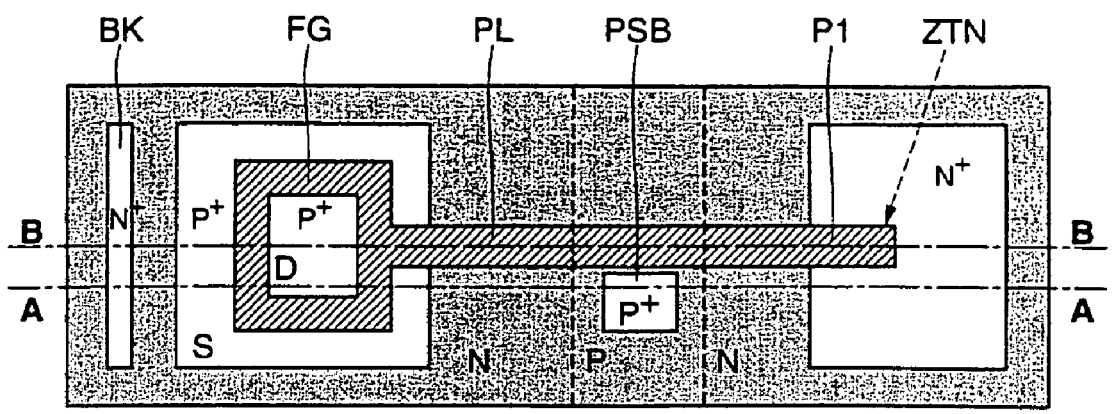
FIGS. 2, 2a, 2b diagrammatically illustrate a second embodiment of a memory device according to the invention.
Figure 2A:
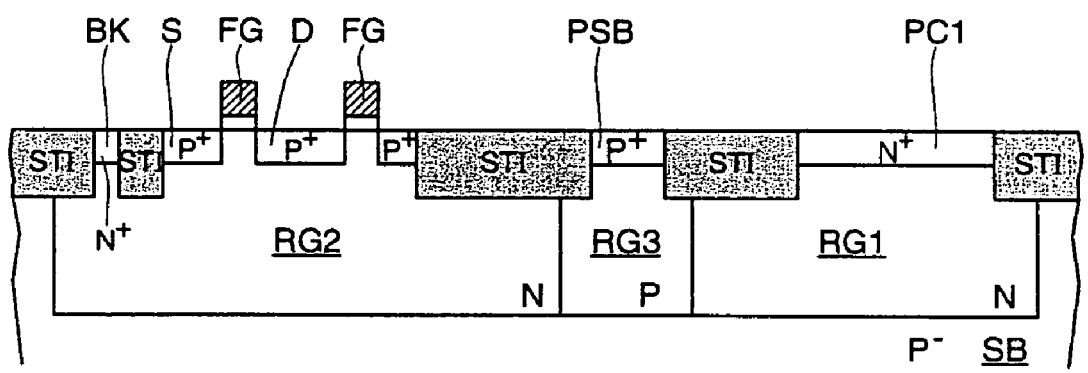
Figure 2B:
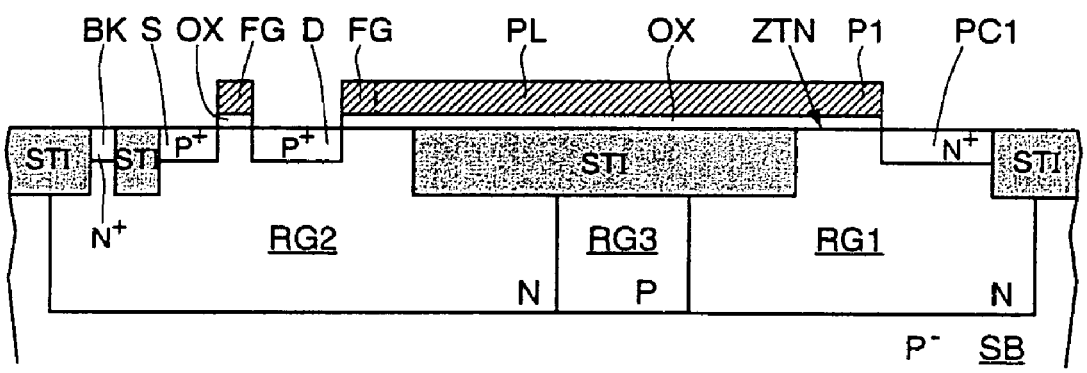

Thus, as illustrated in FIGS. 2, 2a and 2b, the $N^+$-doped contact PC1 of the first active zone may extend over the entire surface of this first active zone, except of course beneath the first part P1 of the gate material. In this case, since there is no implantation in the linking part PL of the gate material, what is then formed, in the gate material is a PIN diode, that is to say a diode formed from a $P^+$ region and an $N^+$ region separated by a region of intrinsic gate material. However, during erasing, this diode is reverse-biased and may somewhat counteract the erasing efficiency. This is the reason why, in some applications, it will be preferred to use the embodiment illustrated in FIGS. 1, 1a and 1b.

In another embodiment, the contact PC1 may remain localized, and the remainder of the N-doped active zone RG1. Another conceivable embodiment is that illustrated in FIGS. 3, 3a and 3b. It will be seen in these figures that there are no isolation zones STI on the surface between the first active zone and the second active zone. In this case, isolation is achieved only by reverse-biased PN junctions.

In the example illustrated in these figures, the first active zone is an $N^+$-type implanted surface zone. However, the $N^+$ contact could be localized and could also have a $P^+$ implantation of the surface zone type similar to that illustrated in FIG. 1. This embodiment, in which the layer of gate material extends entirely above the active zones of the memory cell without overlapping the lateral isolation region, allows better data retention. This is because the phenomenon of oxide thinning at the interface between an isolation zone and the gate material is thus avoided.

However, it will be necessary in this embodiment to use an appropriate mask during the siliciding step so as not to silicide the floating gate or the PN surface functions, and therefore so as not to create a metal short circuit. Furthermore, the fact of not siliciding the floating gate allows better data retention. Of course, the programming, reading and erasing of the memory cells like those illustrated in FIGS. 2 and 3 are similar to those described with reference to FIG. 1.

Finally, although the electrically erasable programmable non-volatile memory cell that has just been described uses a PMOS transistor, construction based on an NMOS transistor is also conceivable. Moreover, several memory cells may be provided so as to form a memory plane which can be erasable bit by bit, so as to form a memory of the EEPROM type, or else erasable by bank or by page so as to form a memory of the FLASH type, however, it will then be necessary to associate an access transistor with each memory cell so as to be able to select it. In this regard, the embodiment of the cell illustrated in FIG. 5 can be used to produce a memory plane such as that illustrated in FIG. 6, offering an architecture of small size with a high cell programming current and good isolation between the lines of bits.

This is obtained according to the invention, especially by the use of an access transistor having a particular shape which will lead to the access transistors of the neighbouring cells being brought into contribution. More specifically, FIG. 5 illustrates a memory cell $CEL_i$ which, assumed here to be flanked by two adjacent memory cells $CEL_{i-1}$ and $CEL_{i+1}$ located in the same column $CL_j$ as the said memory cell (FIG. 6), includes an access transistor with the reference $TACS_i$. This access transistor $TACS_i$ assigned to the memory cell $CEL_i$, partially surrounds the floating-gate FG transistor of the memory cell.

More precisely, this access transistor $TACS_i$ may be divided into three elementary access transistors. Thus, a first elementary access transistor $TACSEL1_i$ specifically associated with the memory cell $CEL_i$. On the other hand, the second elementary access transistor $TACSEL2_i$ and the third elementary access transistor $TACSEL3_i$ are respectively common to the two access transistors $TACS_{i-1}$ and $TACS_{i+1}$, which are assigned to the two adjacent memory cells $CEL_{i-1}$ and $CEL_{i+1}$, respectively. The source of the access transistor $TACS_i$ forms the source of the first elementary access transistor $TACSEL1_i$. Moreover, the drain of the first elementary access transistor $TACSEL1_i$ forms part of the source S of the floating-gate transistor FG of the memory cell.

Figure 6:
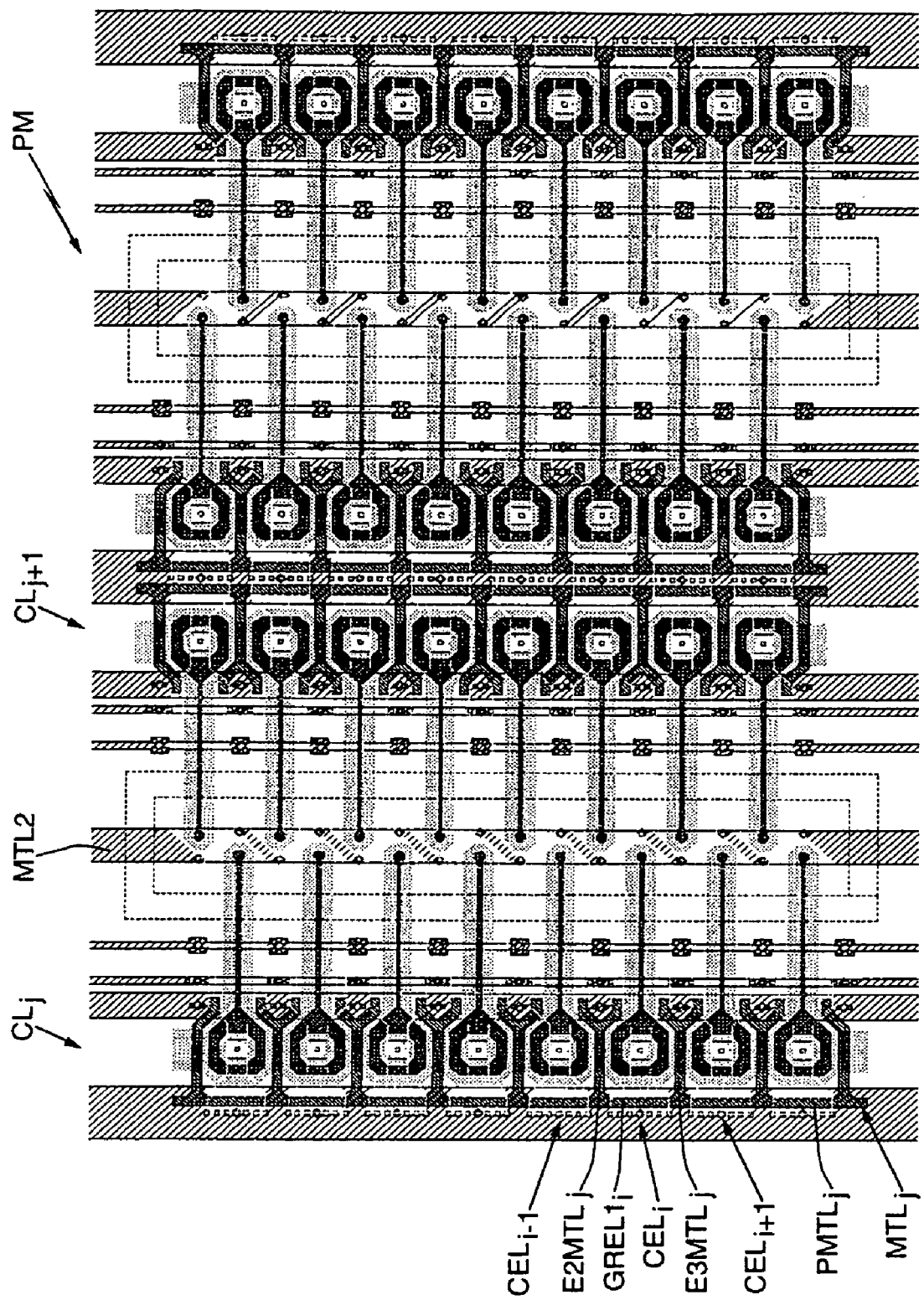
FIG. 6 illustrates one embodiment of such a memory plane.

Referring now more particularly to FIG. 6, which shows the memory plane formed from the cells illustrated in FIG. 5, it may be seen that each memory cell column, for example the column $CL_j$ includes a layer of gate material $MTL_j$ possessing a principal part PMTL extending in the direction of the column along and facing all the floating-gate transistors FG of the cells. The gate $GREL1_i$ of the first elementary transistor $TACSEL1_i$ of the access transistor $TACS_i$ then includes that portion of the said principal part of the layer of gate material $MTL_j$ which is located opposite the floating-gate transistor FG of the cell $CEL_i$.

Moreover, this layer of gate material $MTL_j$ includes, at each memory cell, for example at the memory cell $CEL_i$, a second elementary portion $E2MTL_j$ connected to the principal part $PMTL_j$ and extending approximately perpendicular to this principal part on one side of the floating-gate transistor. This second elementary portion $E2MTL_j$ then forms part of the gate $GREL2_i$ of the second elementary transistor $TACSEL2_i$.

The layer of gate material $MTL_j$ also includes a third elementary portion $E3NMTL_j$, which is also connected to the principal part $PMTL_j$ and extends approximately perpendicular to this principal part on the other side of the floating-gate transistor of the cell $CEL_i$. This third elementary portion $E3MTL_j$ forms part of the gate $GREL3_i$ of the third elementary transistor $TACSEL3_i$.

FIG. 6 also shows that the second elementary portion $E2MTL_j$ associated with a memory cell forms the third elementary portion associated with one of the two adjacent memory cells, while the third elementary portion $E3MTL_j$ associated with the memory cell $CEL_i$ forms the second elementary portion associated with the other of the adjacent memory cells. The source of each access transistor $TACS_i$ includes a plurality of contacts SLC which are all connected together by means of the same metallization.

So as to further increase the current of the access transistor when the latter is on, other contacts SLC are placed externally near the ends of the gates $GREL2_i$ and $GREL3_i$ of the other two elementary access transistors. Moreover, the drain contacts BLC of the memory cells of any one line are connected together and consequently form a bit line. The layer of gate material $MTL_j$ of each column is also intended to be biased by a gate bias voltage, and the metallization for taking the gate bias voltage on to the layer $MTL_j$ forms a column metallization (row line). It should therefore be pointed out here that there is no specific contact on the source S of the floating-gate transistor of a memory cell. This source is consequently floating.

The operation of the memory plane will now be described more particularly, also with reference to FIGS. 7 and 8. In general, the memory device according to the invention includes bias means MPL2 capable of selecting at least one memory cell in programming mode and in read mode and capable of erasing the memory plane by blocks of cells, in this case here by two columns simultaneously. This is because it may be seen in FIG. 6 that all the contacts PC1 of the memory cells of two adjacent columns $CL_j$ and $CL_{j+1}$ are connected together by the same metallization MTL2. On the other hand, in programming or read mode, it will if necessary be possible to select only a single cell at a time by varying the bias of the lines of bits and of the column metallizations (row lines).

It is apparent from the architecture illustrated in FIG. 6 that the bias means are consequently capable of applying the same source bias voltage to the respective sources SLC of the access transistors assigned to the memory cells of the same column, respectively. Moreover, these bias means MPL2 may apply the same gate bias voltage to the respective gates of the access transistors assigned to the memory cells of any one column respectively. Finally, as indicated above, the bias means may apply the same erase voltage to the respective first active zones RG1 of the memory cells of at least any one column, and in this case in particular of two adjacent columns.

Figure 3:
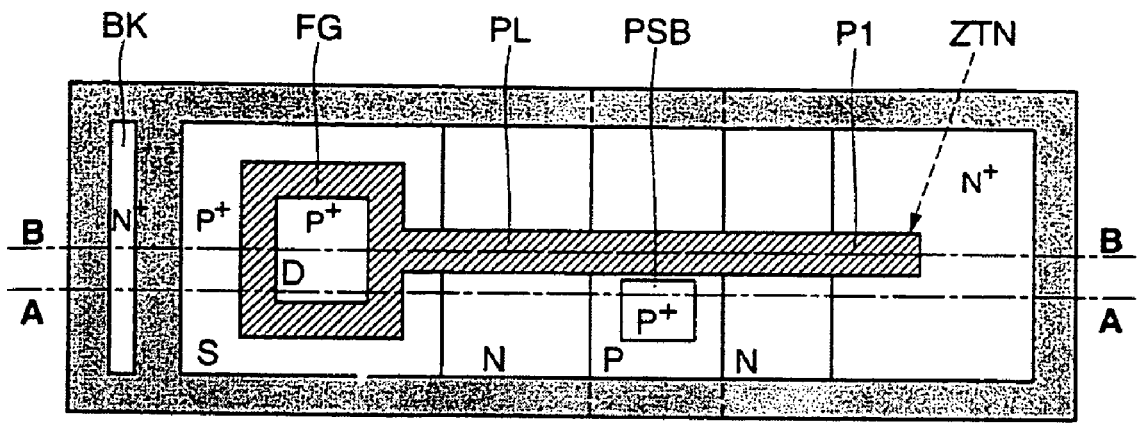
FIGS. 3, 3a, 3b diagrammatically illustrate a third embodiment of a memory device according to the invention.
Figure 3A:
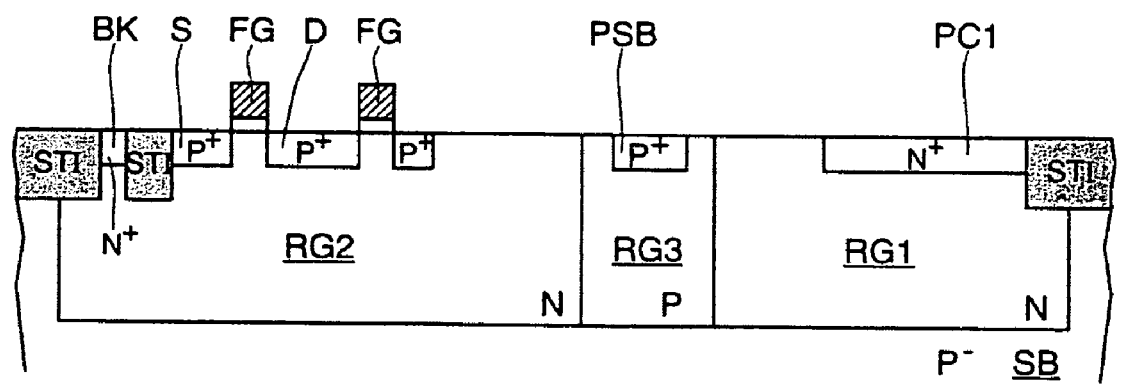
Figure 3B:
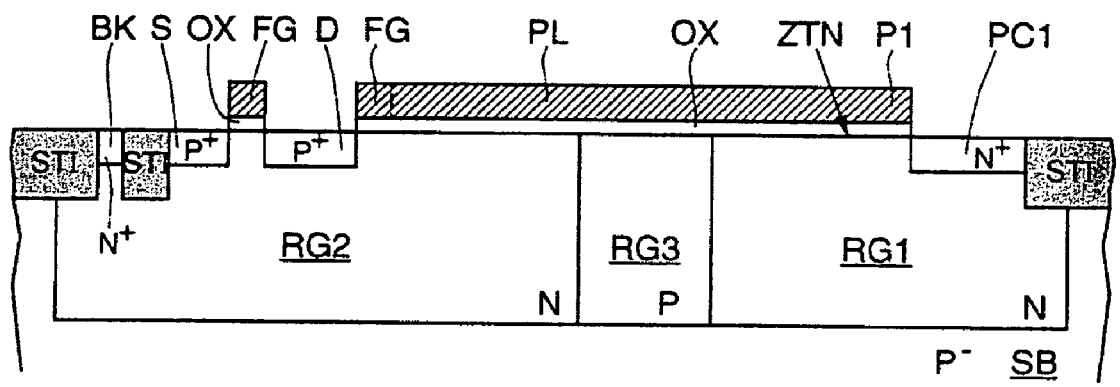

In a manner similar to what has been described in the case of the embodiments illustrated in FIGS. 1 to 3, the bias means MPL2 possess a programming state in which they are capable of programming a memory cell. They also possess a read state in which they are capable of reading a memory cell. Furthermore, they possess an erase state in which they are capable of erasing at least one column of memory cells. In each of these states, the bias means are capable of applying predetermined voltages to the sources and the gates of the access transistors, and to the drains and the substrates of the floating-gate transistors of the cells, and to the first active zones RG1.

Figure 7:
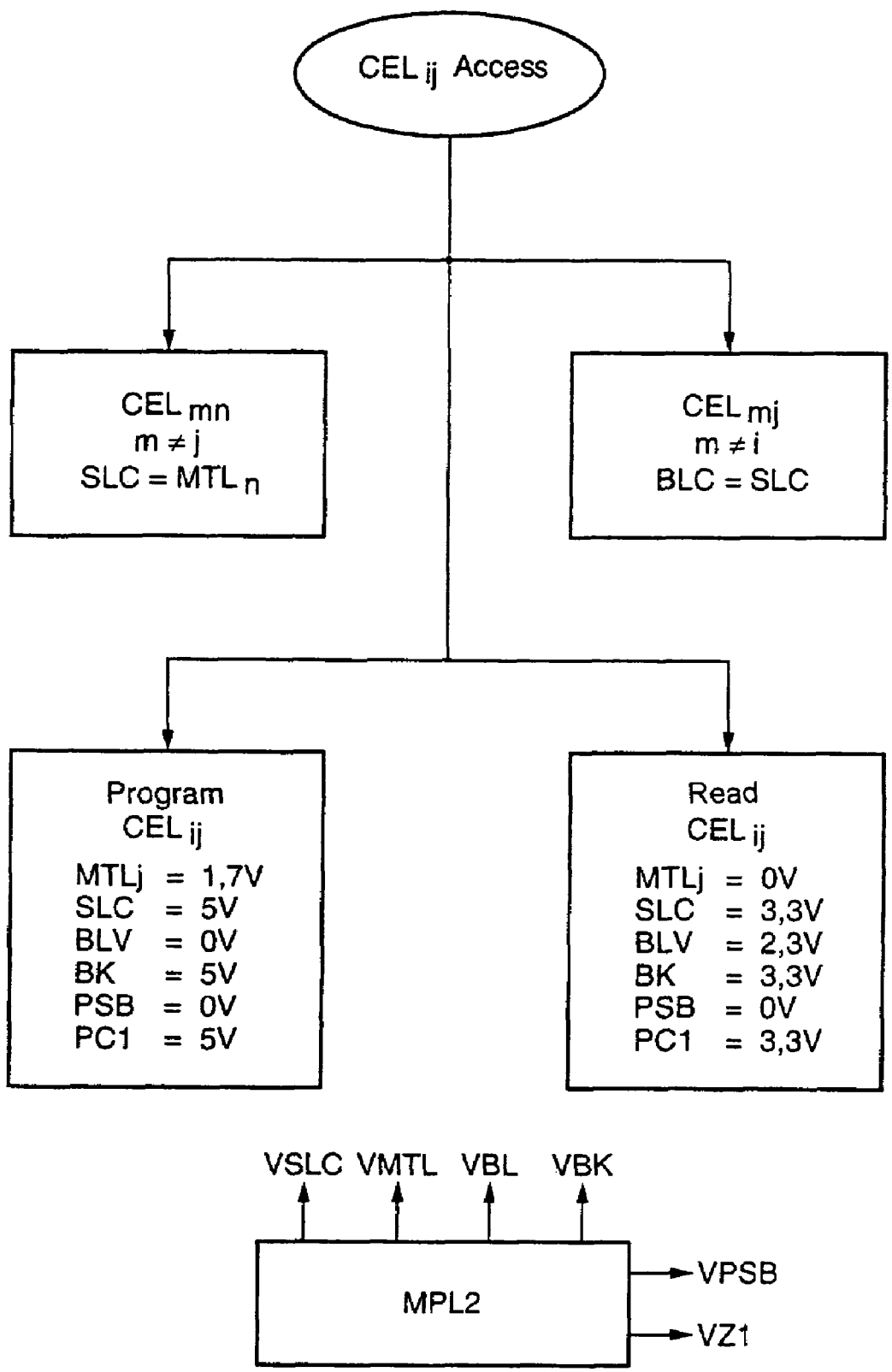
FIGS. 7 and 8 diagrammatically illustrate biases applied to the electrodes of the memory device of FIGS. 5 and 6, depending on the state of these devices.

We now consider the case in which it is desired to access the cell $CEL_{ij}$, this cell belonging to the line i and to the column j (FIG. 7). In general, to access a memory cell in read mode or programming mode, the bias means MPL2 turn on the access transistors of the memory cells belonging to the same column as that of the memory cell in question. Moreover, the bias means apply an identical voltage to the source of the access transistor and the drain of the floating-gate transistor of each memory cell of the said column, different from the memory cell in question, so that the other memory cells of the column are not affected. Finally, the bias means MPL2 can turn off the access transistors of the memory cells belonging to a column other than that of the memory cell in question.

As an example, as illustrated in FIG. 7, in order to program the cell $CEL_{ij}$ the bias means MPL2 apply, for example, a voltage VMTL=1.7 volts to the layer of gate material $MTL_j$ of the column $CL_j$. Moreover, they apply a voltage VLC, equal to 5 volts, for example, to all the source contacts SLC. Consequently, the gate/source voltage difference of all the access transistors of all the cells of the column $CL_j$ is equal to −3.3 volts, which consequently turns on all these access transistors. The bias means MPL2 then apply a voltage VBL equal to 0 volts to the contact BLC (bit line) and they apply voltages VBK, VPSB and VZ1, equal to 5 volts, 0 volts and 5 volts respectively, to the contacts BK, PSB and PC1, respectively.

The cell is then programmed by hot electrons. In this regard, it should be noted here, that the invention is noteworthy in the sense that, since the layer of gate material $MTL_j$ forms an equipotential, all the access transistors, that is to say all the elementary access transistors, are on and contribute to delivering the programming current to the cell in question. Of course, the predominant contribution is provided by the access transistor of the cell and the contribution of an access transistor is smaller the further away this access transistor is from the memory cell to which access is made.

Of course, since it is desirable to access only a single cell of this column and since all the access transistors of the cells of this column are on, it is then necessary, so as not to affect the other cells $CEL_{mj}$ (m different from i) of the same column, to apply equal voltages to the contacts BLC and SLC of these memory cells. In other words, since in the present case the voltage VSLC is fixed at 5 volts, a voltage of 5 volts will be applied to the drains (bit line) of the other cells of the column.

Regarding the cells $CEL_{mn}$ (n different from j), that is to say the cells belonging to the columns other than the column that includes the cell to which access is made, the bias means MPL2 apply a voltage VMTL equal to the voltage VSLC to the gates of the access transistors $MTL_n$. Thus, all the access transistors of the cells of these other columns are off, since the gate/source voltage difference is zero. It should be noted here that very good isolation between two neighbouring bit lines is achieved.

If it is now desired to access the cell $CEL_{ij}$ in read mode, the bias means MPL2 apply a voltage equal to 0 volts to the gates of the access transistors and a voltage equal to 3.3 volts to the sources of the access transistors, so as to turn on the access transistors of the cells of the columns. In this read state, the drain/source voltage difference of the floating-gate transistor is intentionally limited to −1 volt so as to avoid very slow reprogramming of the memory cell. A voltage on the drain of 2.3 volts will then be chosen. The substrate BK will be biased with 3.3 volts. In addition, for example, the contact PSB will be earthed and 3.3 volts applied to the contact PC1.

The erasing of the cells of two neighbouring columns is of the Fowler-Nordheim type. More specifically, in this erase state, the bias means cause Fowler-Nordheim erasing by applying a voltage to the first active zones RG1 which is much higher than that applied to the source regions of the access transistors and to the drain and substrate regions of the floating-gate transistors.

Figure 8:
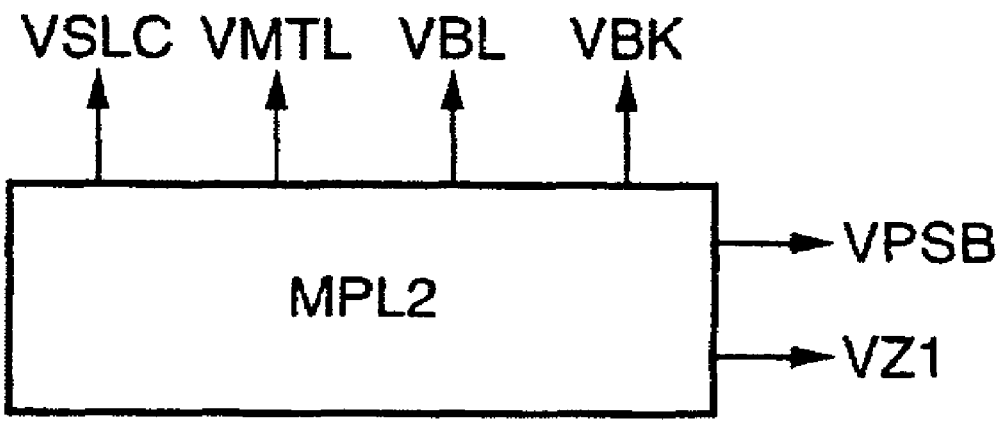

Thus, as an indication, as illustrated in FIG. 8, the bias means MPL2 may apply a voltage VZ1 of 11 volts to the contact PC1, while all the other contacts will be earthed. It should be noted here that the fact that the source of the floating-gate transistor of the memory cell is itself floating is compatible with Fowler-Nordheim erasing via the first active zone RG1. This is because the floating source of the transistor is earthed by the memory location itself.

Figure 11:
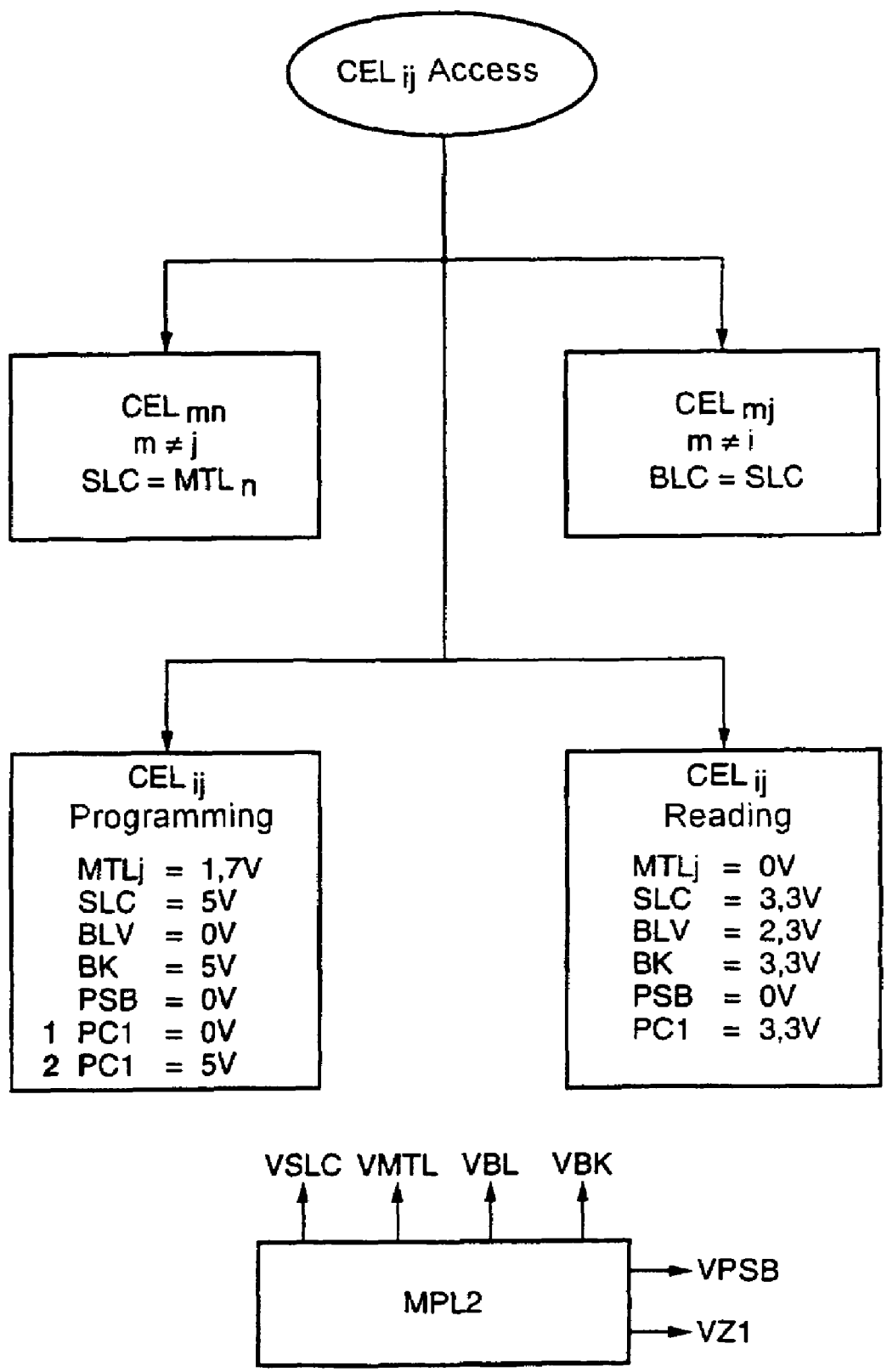

Of course, in the variant illustrated in FIGS. 5 and 6, an isolation of the type illustrated in FIGS. 1, 2 and 3 will be used to mutually isolate the various active regions RG1, RG2 and RG3 of the memory location. Moreover, two-step hot-electron programming of the cells, as described with reference to FIGS. 1, 2, 3, 9 and 10, may also be applied to the memory plane of FIG. 6. More precisely as illustrated in FIG. 11, the bias means MPL2 would then apply in this case, for programming the cell $CEL_{ij}$, firstly a zero voltage VZ1 to the contact PC1 via the metallization $MTLPC_{i,j+1}$ (FIG. 6) and an optimum voltage VZ1 of 5 volts.

Figure 12:
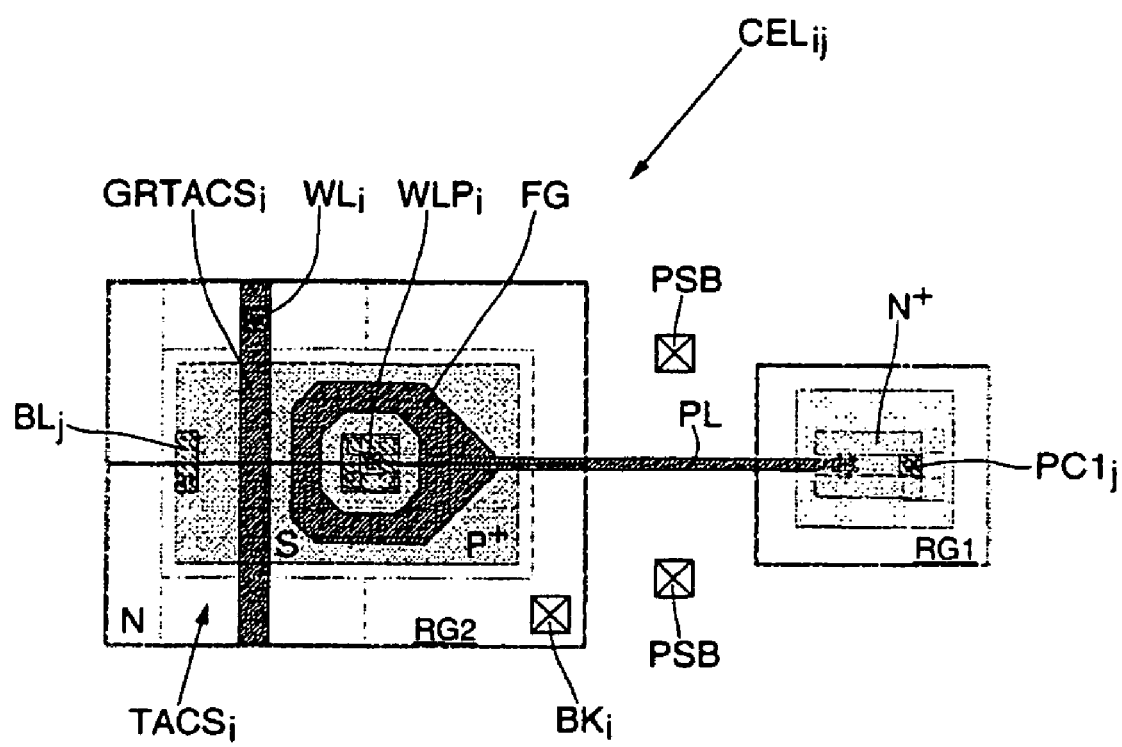
FIG. 12 schematically illustrates a fifth embodiment of a memory device according to the invention, particularly one intended to be incorporated within a memory plane.

A fifth embodiment of a memory cell according to the invention, allowing the production of a memory plane requiring less consumption for the programming phase, thereby making it particularly advantageous for mobile telephone applications for example, will now be described with reference more particularly to FIG. 12 et seq. In FIG. 12, the access transistor $TACS_i$ assigned to a memory cell $CEL_{ij}$ comprises a grid $GRTACS_i$ extending perpendicular to the linking part PL and on the opposite side from this linking part with respect to the annular gate FG.

The source of the access transistor comprises a source contact $BL_j$. The drain of the access transistor forms part of the source S of the floating-gate transistor of the memory cell. The drain of the floating-gate transistor is electrically connected to the second active zone RG2, that is to say to its substrate (or bulk). The drain zone has in fact a contact $WLP_i$ connected via a metallization (not shown in FIG. 12, but illustrated schematically in FIG. 13), to the bulk contact $BK_i$.

Figure 13:
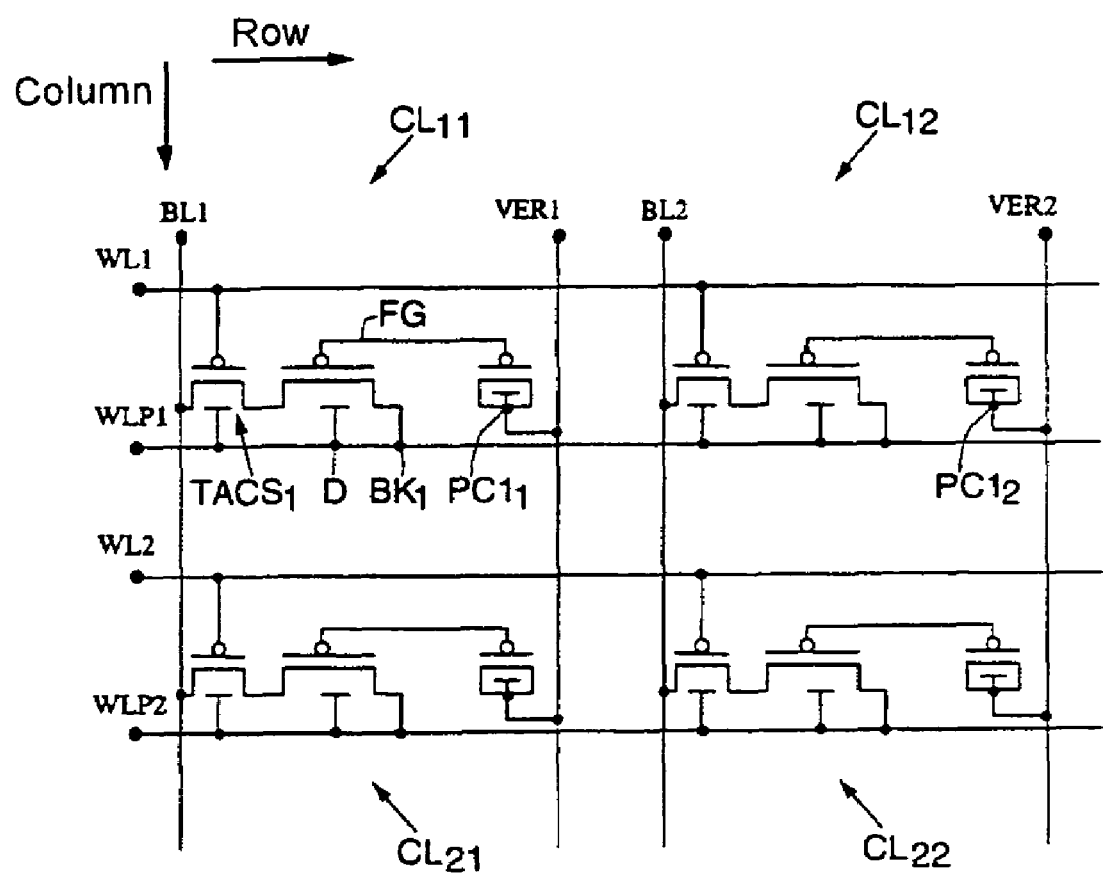
FIGS. 13 and 14 illustrate one embodiment of such a memory plane.
Figure 14:
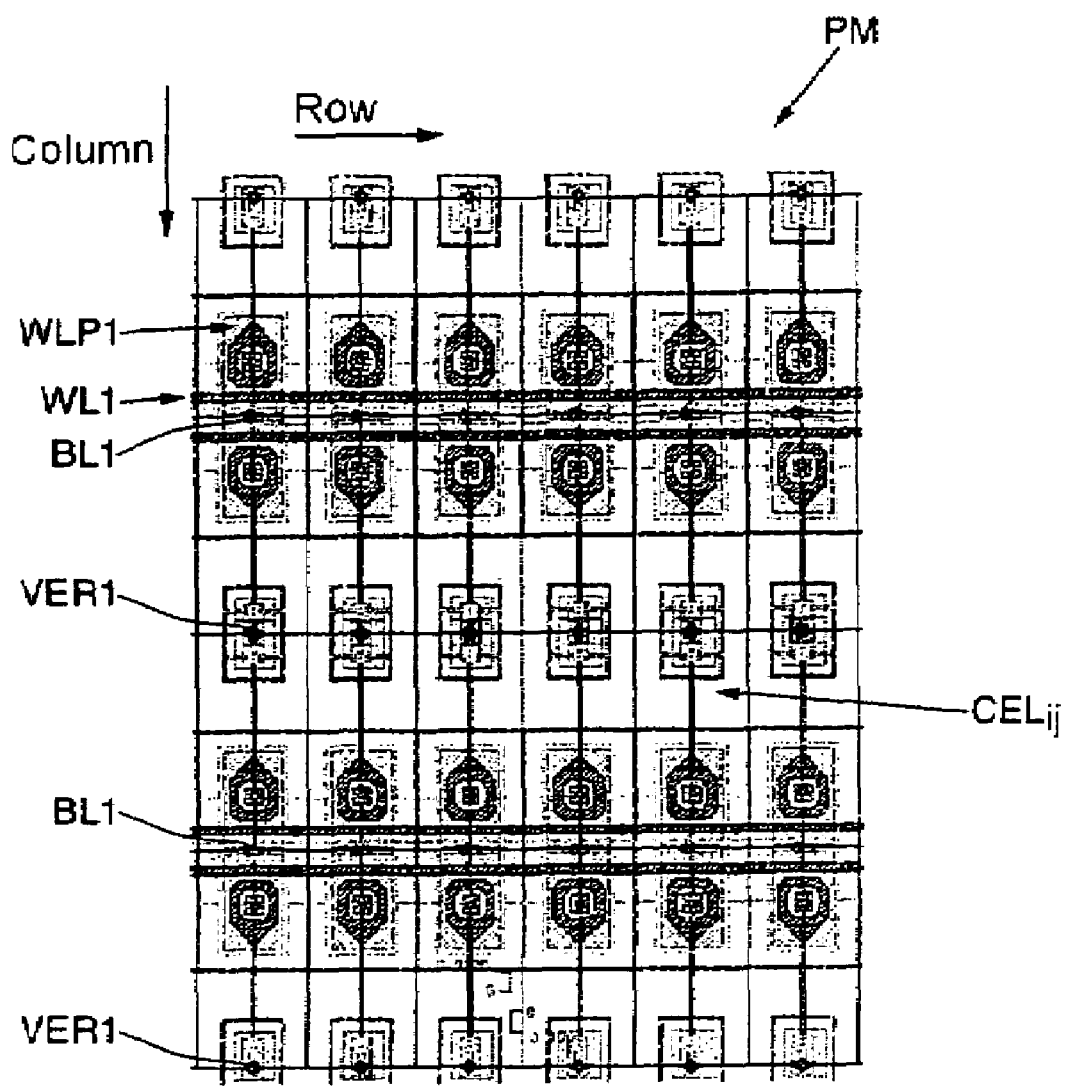

As illustrated in FIGS. 13 and 14, all the source contacts of the access transistors of the cells of any one column j of the memory plane are connected together via a column metallization (bit line), in this case $BL_j$. All the first active zones of the cells of any one column j of the memory plane are connected together via their $PC1_j$ and via another column metallization $VER_j$. All the drain contacts, and consequently all the bulk contacts of the floating-gate transistors of the cells of any one line i, are connected together via a line metallization $WLP_i$. The gates $GRTACS_i$ of the access transistors of the cells of any one line i of the memory plane are connected together and the corresponding contacts $WL_i$ are also connected together via a line metallization $WL_i$. The memory device furthermore includes bias means MPL3 (FIG. 15) capable of selecting at least one memory cell in programming mode and of programming it by Fowler-Nordheim programming.

More precisely, in this embodiment, the bias means are capable of selecting a cell of the memory plane and of programming it by applying a sufficient potential difference between the drain of the floating-gate transistor of the cell and the first active zone of this cell. It is therefore not via the access transistor that a cell is selected in programming.

Figure 15:
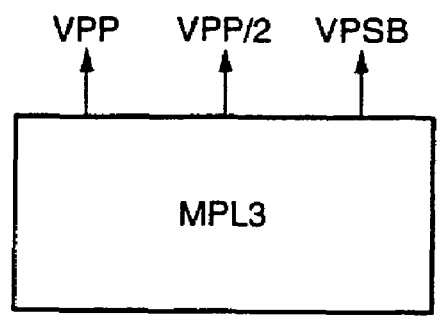
FIG. 15 schematically illustrates the bias voltages applied to the electrodes of the memory device of FIGS. 12 and 13, depending on the state of these devices.

An example of the voltages delivered by the bias means MPL3 and applied to the various metallizations of the memory plane is illustrated in FIG. 15 in conjunction with FIG. 13. More precisely, the configuration 1 of the table given in the top part of FIG. 15 corresponds to a selection and programming of the cell $CEL_{11}$ of FIG. 13. This example assumes that the supply voltage VPP of the integrated circuit is equal to 6.6 volts, since the oxide thickness of the transistors of the cells is around 5 nanometres. This voltage VPP is applied to the metallizations WL1 and WLP1, while the voltage VPP/2 is applied to the metallizations BL1, BL2, WLP2 and VER2. Finally, the metallizations VER1 and WL2 are earthed.

It therefore follows that the access transistor $TACS_1$ of the cell $CEL_{11}$ is off and that the potential of the source of the floating-gate transistor also rises to the voltage VPP by coupling, given that the drain and the substrate are at this potential. Since there then exists a large potential difference (typically 5.6 volts) between the floating gate and the contact $PC1_1$, the cell is programmed by Fowler-Nordheim programming.

However, owing to the application of the voltage VPP/2 to the metallization VER2, there is no sufficient potential difference between the drain of the floating-gate transistor of the cell $CEL_{12}$ and its contact $PC1_2$, and consequently between the floating gate and the contact $PC1_2$. The conditions for Fowler-Nordheim programming are therefore not met. The conditions for Fowler-Nordheim programming are also not met in the case of the cells $CEL_{21}$ and $CEL_{22}$. The bias means MPL3 are also capable of erasing the memory plane in its entirety, for example by applying a high voltage to all the first active zones of all the cells and by applying a zero voltage to the other contacts of the cells.

In this regard, they apply for example, as indicated in the configuration 2 of the table in FIG. 15, a zero voltage to the metallizations BL1, WL1, WLP1, BL2, WL2 and WLP2 and the voltage VPP to the metallizations VER1 and VER2. A Fowler-Nordheim erasing is therefore carried out. It should be noted here that, as in the variant illustrated in FIGS. 5 and 6, the fact that the source of the floating-gate transistor of the memory cell is itself floating, is compatible with Fowler-Nordheim erasing via the first active zone RG1. This is because the floating gate of the transistor is taken to earth via the memory location itself. The bias means MPL3 are also capable of reading the memory plane line by line, by turning on the access transistors of the cells of one line and turning off the access transistors of the cells of the other lines.

An example of the voltages applied is indicated in the configuration 3 of the table in FIG. 15. Throughout all that has just been described in relation to FIGS. 12 to 15, the bias means MPL3 deliver a zero voltage VPSB to the substrate contact PSB. Of course, in the variant illustrated in FIGS. 12 and 14, it would be possible to use an isolation of the type of that illustrated in FIGS. 1, 2 and 3 in order to mutually isolate the various active regions RG1, RG2 and RG3 of the memory location.

The invention claimed is:

1. A semiconductor memory device comprising:
   at least one electrically erasable and programmable nonvolatile memory cell including
      a layer of gate material,
      a floating-gate transistor including a floating gate defined in the layer of gate material, and further including source, drain and channel regions defining a control gate,
      a first active zone, and
      a second active zone incorporating the control gate and electrically isolated from the first active zone,
      a dielectric zone between a first part of the layer of gate material and the first active zone;
   the dielectric zone defining a transfer zone for transferring, during erasure of the memory cell, charges stored in the floating gate to the first active zone.

2. The device according to claim 1, wherein the capacitance of the transfer zone is less than or equal to 30% of a total capacitance between the layer of gate material and the active zones of the memory cell.

3. The device according to claim 1, wherein the floating-gate comprises an annular gate defined in the layer of gate material, and wherein the layer of gate material includes a linking part between the first part and the annular gate.

4. The device according to claim 1, wherein the first active zone and the second active zone are electrically isolated from each other by reverse-biased PN junctions.

5. The device according to claim 4, wherein the first active zone and the second active zone are electrically isolated from each other on a surface of the memory cell by an isolation region.

6. The device according to claim 5, wherein the first active zone is disposed in a first substrate region having a first type of conductivity, the second active zone is disposed in a second substrate region having the first type of conductivity, the first substrate region and the second substrate region are separated by a third substrate region having a second type of conductivity, different from the first, and wherein the isolation region extends between the first substrate region and the second substrate region and includes an aperture in a contact zone in the third semiconductor region.

7. The device according to claim 6, wherein the first substrate region includes, on the surface, a contact zone having the first type of conductivity.

8. The device according to claim 4, wherein the first active zone is disposed in a first substrate region having a first type of conductivity, the second active zone is disposed in a second substrate region having the first type of conductivity, the first substrate region and the second substrate region are separated by a third substrate region having a second type of conductivity, different from the first, and wherein the layer of gate material extends above the three substrate regions without overlapping the isolation region.

9. The device according to claim 8, wherein the first substrate region includes, on the surface, a contact zone having the first type of conductivity.

10. The device according to claim 9, wherein the first substrate region further includes a surface zone having the second type of conductivity and extending around the transfer zone, the surface zone being electrically connected to the contact zone.

11. The device according to claim 1, wherein the floating gate transistor comprises a PMOS transistor.

12. The device according to claim 1, wherein the at least one memory cell comprises a plurality of memory cells defining a memory plane, each memory cell including an access transistor.

13. The device according to claim 1 further comprising a bias device possessing a memory cell programming state, a memory cell read state and a memory cell erase state, wherein the bias device is for applying, in each of the states, predetermined voltages to the source, the drain and the substrate of the floating gate transistor and to the first active zone, and wherein, in the erase state, the bias device causes Fowler-Nordheim erasing by applying a voltage to the first active zone much higher than voltages applied to the source, drain and substrate regions of the floating gate transistor.

14. The device according to claim 13, wherein in the erase state, the bias device applies equal voltages to the source, drain and substrate regions of the floating gate transistor.

15. The device according to claim 13, wherein in the programming state, the bias device causes hot-carrier programming within the floating gate.

16. The device according to claim 13 wherein, in the programming state, the bias device causes Fowler-Nordheim programming by applying equal voltages to the source, drain and substrate regions of the floating gate transistor that are much higher than voltages applied to the first active zone.

17. The device according to claim 13, wherein, in the read state, the drain/source voltage difference is limited to about 1 volt.

18. The device according to claim 1, wherein the at least one memory cell comprises a plurality of memory cells defining a memory plane, each memory cell including an access transistor; wherein the access transistor of a memory cell flanked by two adjacent memory cells located in a same column as the memory cell includes a first elementary access transistor specifically associated with the memory cell and second and third elementary access transistors respectively common to two access transistors assigned to the two adjacent memory cells respectively; wherein a source of the access transistor forms a source of the first elementary access transistor while a drain of the first elementary access transistor forms part of the source of the floating-gate transistor of the memory cell; and further comprising a bias device for selecting at least one memory cell in program mode and in read mode and for erasing the memory plane via blocks of memory cells.

19. The device according to claim 18, wherein the bias device is for applying a same source bias voltage to the respective sources of the access transistors of the memory cells of any one column respectively, a same gate bias voltage to the respective gates of the access transistors of the memory cells of the same column respectively and the same erase voltage to the respective first active zones of the memory cells of at least the same column.

20. The device according to claim 18, wherein the access transistor of a memory cell partially surrounds the floating gate transistor of the memory cell.

21. The device according to claim 20, wherein each column of memory cells has a layer of gate material including a main part extending in the direction of the column along and opposite the floating-gate transistors of the memory cells; wherein the gate of the first elementary access transistor of an access transistor of a memory cell includes a portion of the main part of the layer of gate material which is located opposite the floating-gate transistor of the memory cell; wherein the layer of gate material includes, within each memory cell, a second elementary portion connected to the main part and extending approximately perpendicular to the main part on one side of the floating-gate transistor of the memory cell, to from part of the gate of the second elementary transistor of the access transistor, and a third elementary portion connected to the main part and extending approximately perpendicular to the main part on the other side of the floating-gate transistor of the memory cell, to form part of the gate of the third elementary transistor of the access transistor; and wherein the second elementary portion associated with a memory cell defines the third elementary portion associated with one of the two adjacent memory cells, and the third elementary portion associated with the memory cell defines the second elementary portion associated with the other of the two adjacent memory cells.

22. The device according to claim 18, wherein the bias device possesses a programming state to program a memory cell, a read state to read a memory cell and an erase state to erase at least one column of memory cells; wherein the bias device is for applying, in each of the states, predetermined voltages to the sources and the gates of the access transistors, and to the drains and the substrates of the floating-gate transistors of the memory cells and to the first active zones; and wherein, in the erase state, the bias device causes Fowler-Nordheim erasing by applying a voltage to the first active zones that is much higher than voltages applied to the source regions of the access transistors, and to the drain and substrate regions of the floating-gate transistors.

23. The device according to claim 22, wherein to access a memory cell in read mode or in programming mode, the bias device turns on the access transistors of the memory cells belonging to the same column as that of the memory cell, applies an identical voltage to the source of the access transistor and the drain of the floating-gate transistor of each memory cell of the column different trout the memory cell, and turns off the access transistors of the memory cells belonging to a column other than that of the memory cell.

24. The device according to claim 23, wherein the bias device programs a memory cell that has undergone erasure, the floating gate transistor of which cell is a PMOS transistor, by carrying out hot-electron programming on the transistor in two successive steps to firstly compensate for any residual positive charges present in the floating gate transistor and then to carry out optimum programming.

25. The device according to claim 24, wherein in a first step of the two steps, the bias device compensates for any residual positive charges present in the floating gate transistor by applying a compensation voltage to the contact zone of the first active zone.

26. The device according to claim 25, wherein the compensation voltage is less than or equal to 0 volts and greater than about −500 mV.

27. The device according to claim 3, wherein the at least one memory cell comprises a plurality of memory cells defining a memory plane, each memory cell including an access transistor; wherein the access transistor of a memory cell comprises a gate extending perpendicular to the linking part and on the opposite side from the linking part with respect to the annular gate, wherein the source of the access transistor comprises a source contact, the drain of the access transistor forms part of the source of the floating-gate transistor of the memory cell, and the drain of the floating-gate transistor is electrically connected to the second active zone.

28. The device according to claim 27, wherein the source contacts of the access transistors of the memory cells of any one column of the memory plane are connected together, the first active zones of the memory cells of any one column of the memory plane are connected together, the gates of the access transistors of the memory cells of any one line of the memory plane are connected together, and the corresponding gate contacts are connected together by a line metallization, the drains of the floating-gate transistors of the memory cells of any one line of the memory plane are connected together to form another line metallization, and further comprising a bias device for selecting at least one memory cell in programming mode and for programming the at least one memory cell by Fowler-Nordheim programming.

29. The device according to claim 28, wherein the bias device selects a memory cell of the memory plane and programs the memory cell by applying a sufficient potential difference between the drain of the floating-gate transistor of the memory cell and the first active zone of the memory cell.

30. The device according to claim 28, wherein the bias device is for erasing the memory plane in its entirety.

31. The device according to claim 30, wherein the bias device erases the memory plane in its entirety by applying a high voltage to the first active zones of the memory cells and by applying a zero voltage to other contacts of the memory cells.

32. The device according to one of claim 28, wherein the bias device is for reading the memory plane line by line by turning on the access transistors of the memory cell of a line and by turning off the access transistors of the memory cells of other lines.

33. The device according to claim 28, wherein the memory plane defines at least one of an EEPROM type memory and a FLASH type memory.

34. An integrated circuit comprising a semiconductor memory device according to claim 31.

35. A method of making a semiconductor memory device comprising:

providing at least one electrically erasable and programmable non-volatile memory cell including
a layer of gate material,
a floating-gate transistor including a floating gate defined in the layer of gate material, and further including source, drain and channel regions defining a control gate,
a first active zone, and
a second active zone incorporating the control gate and electrically isolated from the first active zone,
a dielectric zone between a first part of the layer of gate material and the first active zone;
the dielectric zone defining a transfer zone for transferring, during erasure of the memory cell, charges stored in the floating gate to the first active zone.

36. The method according to claim 35, wherein the capacitance of the transfer zone is less than or equal to 30% of a total capacitance between the layer of gate material and the active zones of the memory cell.

37. The method according to claim 35, wherein the floating-gate comprises an annular gate defined in the layer of gate material; and providing the layer of gate material with a linking part between the first part and the annular gate.

38. The method according to claim 35, further comprising electrically isolating the first active zone and the second active zone from each other by reverse-biased PN junctions.

39. The method according to claim 38, further comprising electrically isolating the first active zone and the second active zone from each other on a surface of the memory cell with an isolation region.

40. The method according to claim 39, wherein the first active zone is disposed in a first substrate region having a first type of conductivity, the second active zone is disposed in a second substrate region having the first type of conductivity, the first substrate region and the second substrate region are separated by a third substrate region having a second type of conductivity, different from the first, and wherein the isolation region extends between the first substrate region and the second substrate region and includes an aperture in a contact zone in the third semiconductor region.

41. The method according to claim 40, further comprising providing a contact zone having the first type of conductivity on the surface of the first substrate region.

42. The method according to claim 38, wherein the first active zone is disposed a first substrate region having a first type of conductivity, the second active zone is disposed in a second substrate region having the first type of conductivity, the first substrate region and the second substrate region are separated by a third substrate region having a second type of conductivity, different from the first, and wherein the layer of gate material extends above the three substrate regions without overlapping the isolation region.

43. The method according to claim 42, further comprising providing a contact zone having the first type of conductivity on the surface of the first substrate region.

44. The method according to claim 43, further comprising providing a surface zone having the second type of conductivity and extending around the transfer zone in the first substrate region; and electrically connecting the surface zone to the contact zone.

45. The method according to claim 35, wherein the floating gate transistor comprises a PMOS transistor.

46. The method according to claim 35, wherein the at least one memory cell comprises a plurality of memory cells defining a memory plane; further comprising providing each memory cell with an access transistor.

47. The method according to claim 35 further comprising providing a bias device possessing a memory cell programming state, a memory cell read state and a memory cell erase state, wherein the bias device is for applying, in each of the states, predetermined voltages to the source, the drain and the substrate of the floating gate transistor and to the first active zone, and wherein, in the erase state, the bias device causes Fowler-Nordheim erasing by applying a voltage to the first active zone much higher than voltages applied to the source, drain and substrate regions of the floating gate transistor.

48. The method according to claim 47, wherein in the erase state, the bias device applies equal voltages to the source, drain and substrate regions of the floating gate transistor.

49. The method according to claim 47, wherein in the programming state, the bias device causes hot-carrier programming within the floating gate transistor.

50. The method according to claim 47 wherein, in the programming state, the bias device causes Fowler-Nordheim programming by applying equal voltages to the source, drain and substrate regions of the floating gate transistor that are much higher than voltages applied to the first active zone.

51. The method according to claim 47, wherein, in the read state, the drain/source voltage difference is limited to about 1 volt.

52. The method according to claim 35, wherein the at least one memory cell comprises a plurality of memory cells defining a memory plane; further comprising providing each memory cell with an access transistor; wherein the access transistor of a memory cell flanked by two adjacent memory cells located in a same column as the memory cell includes a first elementary access transistor specifically associated with the memory cell and second and third elementary access transistors respectively common to two access transistors assigned to the two adjacent memory cells respectively; wherein a source of the access transistor forms a source of the first elementary access transistor while a drain of the first elementary access transistor forms part of the source of the floating-gate transistor of the memory cell; and further comprising a bias device for selecting at least one memory cell in program mode and in read mode and for erasing the memory plane via blocks of memory cells.

53. The method according to claim 52, wherein the bias device is for applying a same source bias voltage to the respective sources of the access transistors of the memory cells of any one column respectively, a same gate bias voltage to the respective gates of the access transistors of the memory cells of the same column respectively and the same erase voltage to the respective first active zones of the memory cells of at least the same column.

54. The method according to claim 52, wherein the access transistor of a memory cell partially surrounds the floating gate transistor of the memory cell.

55. The method according to claim 54, wherein each column of memory cells has a layer of gate material including a main part extending in the direction of the column along and opposite the floating-gate transistors of the memory cells; wherein the gate of the first elementary access transistor of an access transistor of a memory cell includes a portion of the main part of the layer of gate material which is located opposite the floating-gate transistor of the memory cell; wherein the layer of gate material includes, within each memory cell, a second elementary portion connected to the main part and extending approximately perpendicular to the main part on one side of the floating-gate transistor of the memory cell, to form part of the gate of the second elementary transistor of the access transistor, and a third elementary portion connected to the main part and extending approximately perpendicular to the main part on the other side of the floating-gate transistor of the memory cell, to form part of the gate of the third elementary transistor of the access transistor; and wherein the second elementary portion associated with a memory cell defines the third elementary portion associated with one of the two adjacent memory cells, and the third elementary portion associated with the memory cell defines the second elementary portion associated with the other of the two adjacent memory cells.

56. The method according to claim 52, wherein the bias device possesses a programming state to program a memory cell, a read state to read a memory cell and an erase state to erase at least one column of memory cells; wherein the bias device is for applying, in each of the states, predetermined voltages to the sources and the gates of the access transistors, and to the drains and the substrates of the floating-gate transistors of the memory cells and to the first active zones; and wherein, in the erase state, the bias device causes Fowler-Nordheim erasing by applying a voltage to the first active zones that is much higher than voltages applied to the source regions of the access transistors, and to the drain and substrate regions of the floating-gate transistors.

57. The method according to claim 52, wherein to access a memory cell in read mode or in programming mode, the bias device turns on the access transistors of the memory cells belonging to the same column as that of the memory cell, applies an identical voltage to the source of the access transistor and the drain of the floating-gate transistor of each memory cell of the column different from the memory cell, and turns off the access transistors of the memory cells belonging to a column other than that of the memory cell.

58. The method according to claim 57, wherein the bias device programs a memory cell that has undergone erasure, the floating gate transistor of which cell is a PMOS transistor, by carrying out hot-electron programming on the transistor in two successive steps to firstly compensate for any residual positive charges present in the floating gate transistor and then to carry out optimum programming.

59. The method according to claim 58, wherein in a first step of the two steps, the bias device compensates for any residual positive charges present in the floating gate transistor by applying a compensation voltage to the contact zone of the first active zone.

60. The device according to claim 59, wherein the compensation voltage is less than or equal to 0 volts and greater than about −500 mV.

61. The method according to claim 37, wherein the at least one memory cell comprises a plurality of memory cells defining a memory plane; further comprising providing each memory cell with an access transistor; wherein the access transistor of a memory cell comprises a gate extending perpendicular to the linking part and on the opposite side from the linking part with respect to the annular gate; wherein the source of the access transistor comprises a source contact, the drain of the access transistor forms part of the source of the floating-gate transistor of the memory cell, and the drain of the floating-gate transistor is electrically connected to the second active zone.

62. The device according to claim 61, wherein the source contacts of the access transistors of the memory cells of any one column of the memory plane are connected together, the first active zones of the memory cells of any one column of the memory plane are connected together, the gates of the access transistor of the memory cells of any one line of the memory plane are connected together, and the corresponding gate contacts are connected together by a line metallization, the drains of the floating-gate transistors of the memory cells of any one line of the memory plane are connected together to form another line metallization; and further comprising a bias device for selecting at least one memory cell in programming mode and for programming the at least one memory cell by Fowler-Nordheim programming.

63. The method according to claim 62, wherein the bias device selects a memory cell of the memory plane and programs the memory cell by applying a sufficient potential difference between the drain of the floating-gate transistor of the memory cell and the first active zone of the memory cell.

64. The method according to claim 62, wherein the bias device is for erasing the memory plane in its entirety.

65. The method according to claim 64, wherein the bias device erases the memory plane in its entirety by applying a high voltage to the first active zones of the memory cells and by applying a zero voltage to other contacts of the memory cells.

66. The method according to claim 62, wherein the bias device is for reading the memory plane line by line by turning on the access transistors of the memory cell of a line and by turning off the access transistors of the memory cells of other lines.

67. The method according to claim 62, wherein the memory plane defines at least one of an EEPROM type memory and a FLASH type memory.

* * * * *

UNITED STATES PATENT AND TRADEMARK OFFICE
CERTIFICATE OF CORRECTION

| | | |
|---|---|---|
| PATENT NO. | : 7,333,362 B2 | Page 1 of 1 |
| APPLICATION NO. | : 10/511712 | |
| DATED | : February 19, 2008 | |
| INVENTOR(S) | : Gendrier et al. | |

It is certified that error appears in the above-identified patent and that said Letters Patent is hereby corrected as shown below:

Column 16, Line 65
Delete: "31"
Insert: -- 1 --

Column 17, Line 46
Delete: "disposed a"
Insert: -- disposed in a --

Column 20, Line 17
Delete: "transistor"
Insert: -- transistors --

Signed and Sealed this

Sixteenth Day of September, 2008

JON W. DUDAS
*Director of the United States Patent and Trademark Office*